US006999364B2

(12) United States Patent
Hosokawa et al.

(10) Patent No.: US 6,999,364 B2
(45) Date of Patent: Feb. 14, 2006

(54) DRAM CIRCUIT AND ITS OPERATION METHOD

(75) Inventors: Kohji Hosokawa, Shiga (JP); Yohtaroh Mori, Shiga (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,292

(22) Filed: Sep. 19, 2003

(65) Prior Publication Data

US 2004/0114421 A1    Jun. 17, 2004

(30) Foreign Application Priority Data

Sep. 20, 2002    (JP)    ............................. 2002-274432

(51) Int. Cl.
*G11C 7/00*    (2006.01)
(52) U.S. Cl. ........................................ 365/205; 365/63
(58) Field of Classification Search ................ 365/205, 365/63
See application file for complete search history.

(56) References Cited

U.S. PATENT DOCUMENTS

| | | | | |
|---|---|---|---|---|
| 4,903,344 | A * | 2/1990 | Inoue ........................... | 365/51 |
| 5,111,434 | A * | 5/1992 | Cho ............................. | 365/207 |
| 5,383,159 | A * | 1/1995 | Kubota ......................... | 365/207 |
| 5,999,480 | A * | 12/1999 | Ong et al. ............... | 365/230.06 |
| 6,046,940 | A * | 4/2000 | Takeuchi et al. ....... | 365/185.17 |
| 6,845,035 | B1 * | 1/2005 | Ooishi ......................... | 365/149 |

FOREIGN PATENT DOCUMENTS

| | | |
|---|---|---|
| JP | 02-183489 | 7/1990 |
| JP | 04-094569 | 3/1992 |
| JP | 07-094597 | 4/1995 |
| JP | 2001-168300 | 6/2001 |

OTHER PUBLICATIONS

Article: IEEE Journal of Solid-State Circuits, vol. 34, No. 6, Jun. 1999 "Multiple Twisted Dataline Techniques for Multigigabit DRAMs's", by Dong-Sun Min, pp. 856-865.
Article in ISSCC 2002 Digest of Technical Papers, Sessin 9, 9.3 "A 300MHz Multi-banked eDRAM Macro Featuring GND Sense, Bit-Line Twisting and Direct Reference Cell Write" by John Barth, Darren Anand, Jeff Dreibelbis, Erik Nelson pp. 156-157.

* cited by examiner

*Primary Examiner*—Michael Tran
(74) *Attorney, Agent, or Firm*—Ira D. Blecker

(57) ABSTRACT

A high-density DRAM in a MTBL method which reduces interference noise between bit lines is provided. Duplication of sense amplifiers (SA) and bit switches (BSW) in a conventional MTBL method is eliminated, and one line of sense amplifiers and bit switches (BSW/SA) is arranged between cell areas. Specifically, arrays are horizontally moved and vertically cumulated so as to reduce the areas. Bit line pairs to be connected are alternately interchanged above and below, every one horizontally aligned sense amplifier (SA). Bit lines of a bit line pair 11 cross at one place on the way, and from the cross, a space between the bit lines is wider. Further, bit lines of a bit line pair 16 do not cross each other, and a space between the bit lines is wider on the way. In a new MTBL method, both in the bit lines connected to the same sense amplifier and in the bit lines among adjacent bit lines connected to the different sense amplifiers, a space between the bit lines changes (widens or narrows) before and after the cross. Thus, the interference noise between any adjacent bit lines is decreased.

10 Claims, 8 Drawing Sheets

FIG.8

| | ARRAY CONFIGURATION IN PRESENT INVENTION | ARRAY CONFIGURATION IN PRIOR ART TBL METHOD | ARRAY CONFIGURATION IN PRIOR ART MTBL METHOD |
|---|---|---|---|
| HEIGHT OF SENSE AMPLIFIER AND BIT SWITCH PER ARRAY | 35 MICRO METERS | 35 MICRO METERS | 70 MICRO METERS |
| ACTUAL AREA PER ARRAY (HEIGHT OF ALL WORD LINES) | 239.2 MICRO METERS | 239.2 MICRO METERS | 239.2 MICRO METERS |
| AREA LOSS PORTION PER ARRAY (HEIGHT OF BIT LINE CROSSING AND RFWL AREA) | 9.2 MACRO METERS | 18.4 MACRO METERS | 9.2 MACRO METERS |
| HEIGHT OF 16 Mb MACRO (16 ARRAYS VERTICALLY CUMULATED) | 4569.4 MICRO METERS | 4681.6 MICRO METERS | 5094.4 MICRO METERS |

DRAM CIRCUIT AND ITS OPERATION METHOD

BACKGROUND OF INVENTION

1. Field of the Invention

The present invention relates generally to a DRAM circuit and an operating method thereof, and more particularly, to an arrangement of a sense amplifier and a peripheral circuit thereof in a DRAM array, and an operation of the sense amplifier.

2. Background of the Invention

In a DRAM, each space between bit lines is narrowed with progress of a process technology, so that a problem of increasing an interference noise occurs. The interference noise referred to here means a noise resulting from a coupling capacitance between the bit lines. This interference noise can be classified into an interference noise between the bit lines connected to one sense amplifier and an interference noise between the adjacent bit lines connected to different sense amplifiers.

As a conventional technique to overcome the problem of the interference noise, there is a twisted bit line system (hereinafter, referred to as the TBL system). Examples of known documents regarding the TBL system include Japanese Patent Application Laid-open Nos. 183489/1990, 94569/1992, 94597/1995 and 168300/2001, the disclosure of which are incorporated by reference herein. FIG. 1 is a conceptual view of the TBL system for use in an embedded DRAM (hereinafter, referred to as the eDRAM) which is a product of IBM Corporation (known document: ISSCC 2002 Digest of Technical Papers, pp. 156–157, the disclosures of which is incorporated by reference herein). In FIG. 1, bit line pairs (BL0t, BL0c) to (BL3t, BL3c) are connected to sense amplifiers (SA) and bit switches (BSW) while they cross each other on the way. This cross of the bit lines reduces the interference noise between the bit lines (e.g., BL0c and BL1t) connected to the adjacent different sense amplifiers. That is because a space between the bit lines (for example, BL0c and BL1t) changes (broadly or narrowly) from the position of the cross.

However, in the system of FIG. 1, there is a problem that the interference noise between the bit lines connected to the one sense amplifier is not reduced. That is because a space between the bit lines (e.g., BL0t and BL0c) does not change from the position of the cross. Furthermore, as viewed in a vertical direction, the bit lines cross at three portions, and hence, there is a problem that its cross area prevents the realization of a high density, because the connection of a memory cell is impossible at the cross of the bit lines. An area loss at one cross corresponds to about two cells. Owing to the three bit line crosses, there is a problem that four reference word lines (RFWL0–4) is necessary for a read operation and the area for these word lines also prevents the realization of the high density. In the DRAM of, for example, a (½) Vdd pre-charge system which does not need the reference word lines (RFWL0–4), there does not rise any problem regarding the reference word lines (RFWL0–4).

Another prior art which solves the problems of interference noise includes a multiple twisted bit line method (hereinafter referred to as an MTBL method). FIG. 2 shows an example of the MTBL method (known document: IEEE JSSC vol 34, No 6, pp. 856–865 June 1999, the disclosure of which is incorporated by reference herein). In the method of FIG. 2, bit lines of a bit line pair (BL1t, BL1c) cross at one place on the way, and from the crossing, a space between the bit lines is wider. The same is seen in a bit line pair (BL3t, BL3c). Bit lines of a bit line pair (BL0t, BL0c) do not cross, and a space between the bit lines is wider on the way. The same is seen in a bit line pair (BL2t, BL2c). Therefore, in the MTBL method of FIG. 2, both in the bit lines connected to the same sense amplifier (e.g., BL1t, BL1c) and in the bit lines among adjacent bit lines connected to the different sense amplifiers (e.g., BL0c, BL1c), the space between the bit lines changes (widens or narrows) before and after the cross. Thus, the interference noise between any adjacent bit lines is decreased. In this regard, the MTBL method of FIG. 2 is superior to the TBL method of FIG. 1.

Furthermore, the bit lines cross at one place in the method of FIG. 2. In addition, only two reference word lines (RFWL0, 1) are sufficient. Accordingly, the MTBL method of FIG. 2 has an effect of area improvement, as compared with the TBL method of FIG. 1.

However, in the MTBL method of FIG. 2, the sense amplifiers (SA) and the bit switches (BSW) are needed on both sides of the array, which causes a loss of area. For example, the eDRAM is configured by cumulating the constitution of FIG. 2 as a macro, as shown in FIG. 3. Therefore, as shown in FIG. 4, duplication of the sense amplifiers (SA) and the bit switches (BSW) is caused above and below the arrays and takes up the area for them, thus causing a problem of preventing high density. For example, in the eDRAM of 16 Mb shown in FIG. 3 in which 16 DRAMs of 1 Mb are piled up, an area of about 525 micrometers, which is fifteen times as high as the 35-micrometer sense amplifiers (SA) and the bit switches (BSW), is unnecessarily used.

The present invention has been attained to solve the problems of the prior art described above, and its object is to provide a DRAM which reduces interference noise between bit lines.

Furthermore, an object of the present invention is to apply a high-density DRAM which reduces interference noise between bit lines.

Still further, an object of the present invention is to provide a high-density DRAM in an MTBL method which reduces interference noise between bit lines.

SUMMARY OF INVENTION

According to the present invention, there is provided, for example, a DRAM circuit comprising a plurality of aligned sense amplifiers, bit line pairs connected to the plurality of sense amplifiers, respectively, and memory cells connected respectively to the bit lines constituting the bit line pairs, wherein the bit line pairs and the memory cells are alternately arranged on a right side (upper side) and a left side (lower side) of the sense amplifiers per N (N: natural number) aligned sense amplifiers.

According to the present invention, there is provided, for example, a DRAM circuit comprising a plurality of sense amplifiers SA (J, K) arranged in Q lines each containing the P sense amplifiers, bit line pairs connected to the plurality of sense amplifiers SA (J, K), respectively, and memory cells connected respectively to the bit lines constituting the bit line pairs, wherein the sense amplifier SA (J, K) is connected to each of the bit line pairs arranged between the sense amplifier SA (J, K) and a sense amplifier SA (J, K−1) in one next line or a sense amplifier SA (J, K+1) in the other next line;

a sense amplifier SA (J+1, K) is connected to the bit line pairs arranged between the sense amplifier SA (J+1, K) and a sense amplifier SA (J+1, K+1) in one next line or a sense amplifier SA (J+1, K−1) in the other next line;

a sense amplifier SA (J+3, K) is connected to each of the bit line pairs arranged between the sense amplifier SA (J+3, K) and a sense amplifier SA (J+2, K−1) in one next line or a sense amplifier SA (J+2, K+1) in the other next line; and P and Q are both integers of more than 3, J is an arbitrary integer of more than 1 and less than P, and K is an arbitrary integer of more than 1 and less than Q.

Furthermore, according to the present invention, there is provided, for example, an operation method of a DRAM circuit comprising a plurality of aligned sense amplifiers, bit line pairs connected to the plurality of sense amplifiers, respectively, and memory cells connected respectively to the bit lines constituting the bit line pairs, wherein the bit line pairs and memory cells are alternately arranged on a right side (upper side) and a left side (lower side) of the sense amplifiers per N (N: natural number) aligned sense amplifiers, the method comprising a step of activating the plurality of sense amplifiers connected to the bit line pairs and memory cells arranged on the right side (upper side) of the sense amplifiers, and the plurality of sense amplifiers connected to the bit line pairs and memory cells arranged on the left side (lower side) of the sense amplifiers at different timing, when data is read.

BRIEF DESCRIPTION OF DRAWINGS

FIG. 8 is a view showing a size comparison in the case of a vertically cumulated macro of 16 Mb.

DETAILED DESCRIPTION

Figure 4:
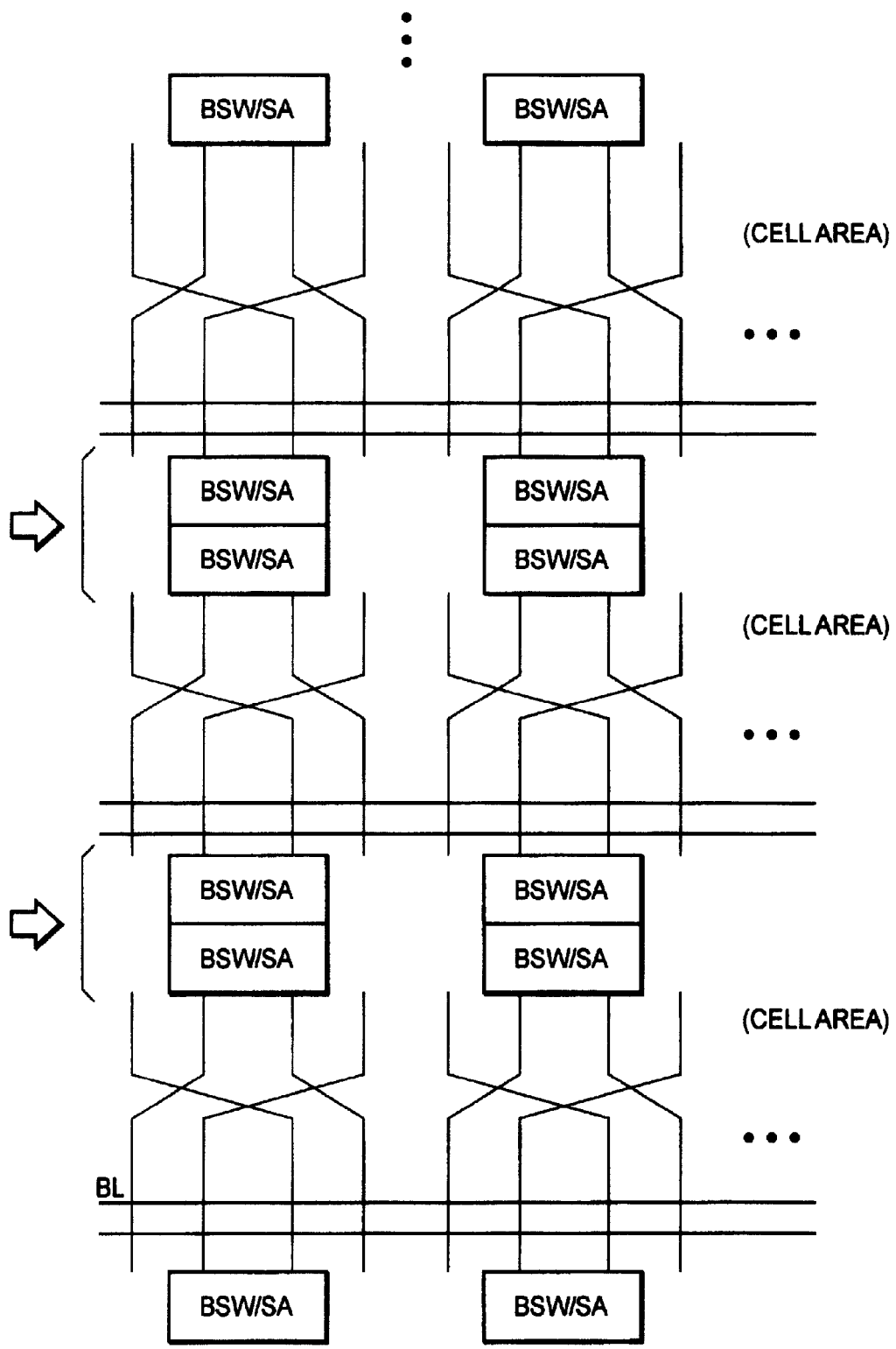
FIG. 4 is a view showing a configuration as a macro in the conventional MTBL method of FIG. 2.
Figure 5:
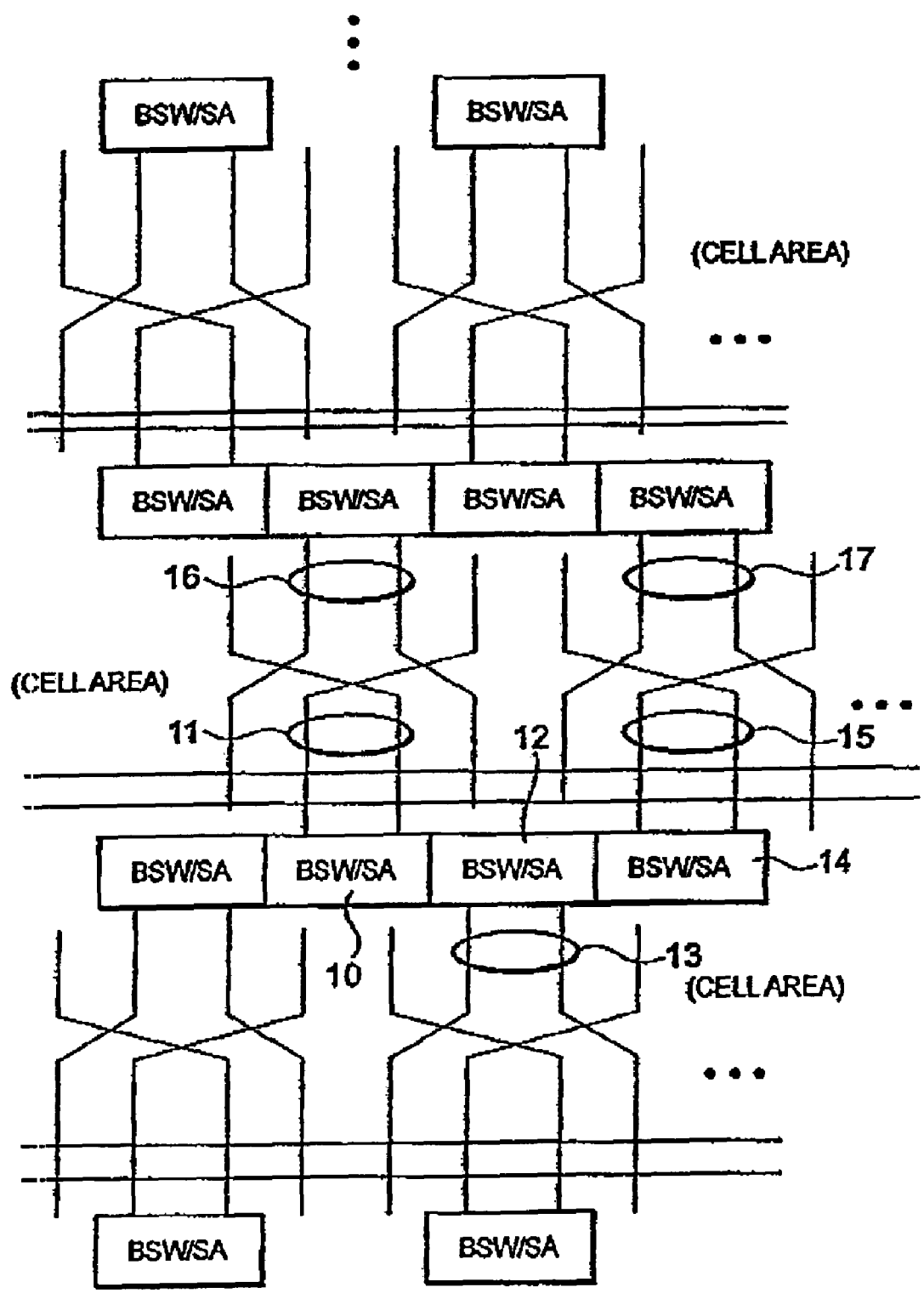
FIG. 5 is a view showing one embodiment of the present invention.

An embodiment of the present invention will hereinafter be described in detail in reference to the drawings. It should be noted that the following description is based on an embedded DRAM (eDRAM) of IBM corporation, but it is needless to mention that the present invention is applicable to all other multi-purpose DRAMs. FIG. 5 is a conceptual view showing the configuration of the present invention. In the configuration of FIG. 5, duplication of sense amplifiers (SA) and bit switches (BSW) in the conventional configuration of FIG. 4 (MTBL method) is eliminated, and one line of sense amplifiers and bit switches (BSW/SA) is arranged between cell areas. Specifically, in the configuration of FIG. 5, arrays are horizontally moved and vertically cumulated so as to reduce the areas. In the new method configuration of FIG. 5, an upper array and a lower array have a difference of one sense amplifier, but this is actually a difference of one sense amplifier in the 2048 sense amplifiers horizontally arranged, so that the loss caused thereby can be neglected.

In FIG. 5, the bit line pairs to be connected are alternately interchanged above and below every one horizontally aligned sense amplifier (SA). For example, a sense amplifier (SA) 10 is connected to an upper bit line pair 11, and on its right, a sense amplifier (SA) 12 is connected to a lower bit line pair 13, and further on its right, a sense amplifier (SA) 14 is connected to an upper bit line pair 15. The same applies to the others. Note that the bit line pairs to be connected may be alternately interchanged above and below, not every one sense amplifier (SA) but every two or more plural (N) sense amplifiers (SA).

Figure 1:
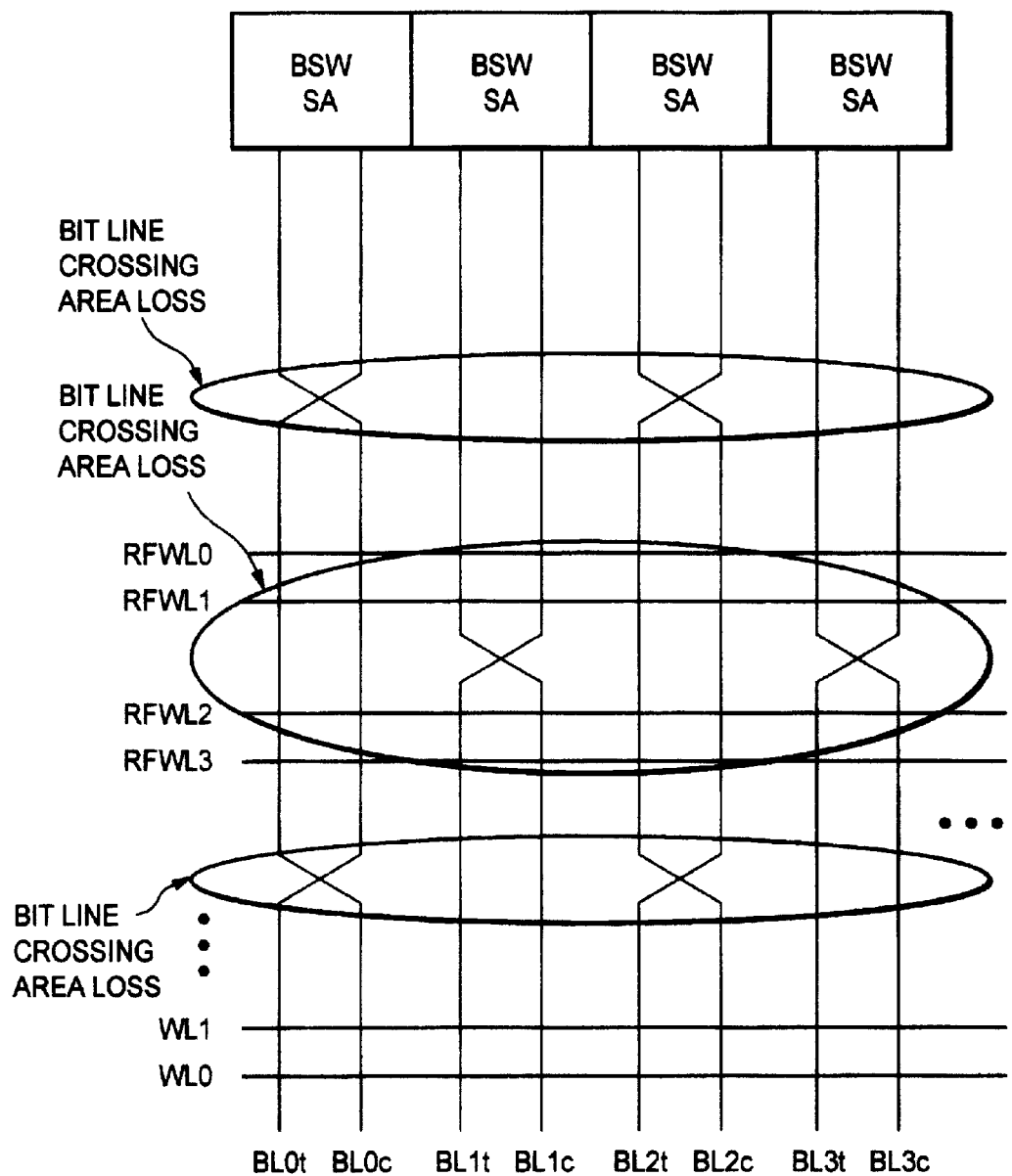
FIG. 1 is a conceptual view of a conventional TBL method.
Figure 2:
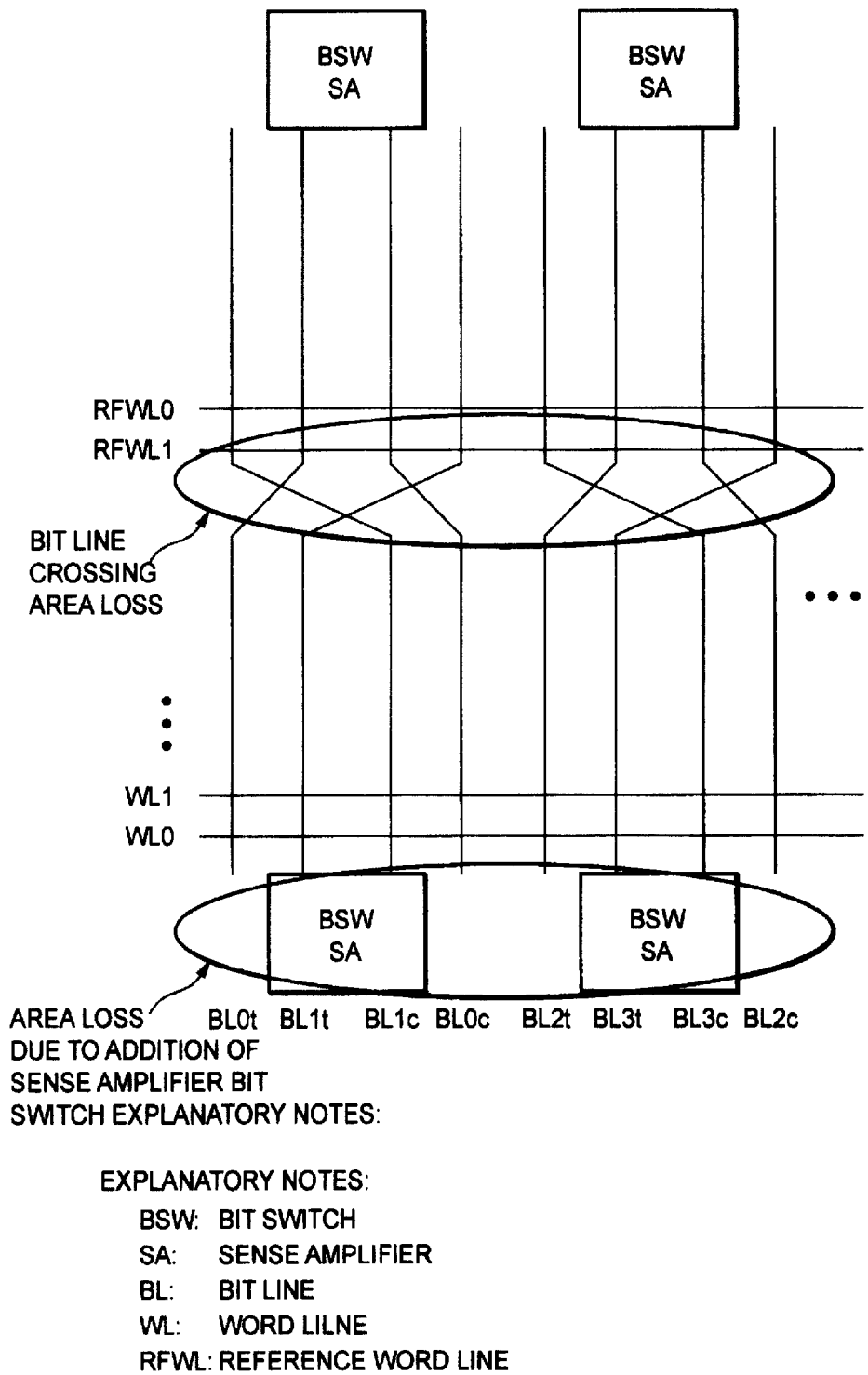
FIG. 2 is a conceptual view of a conventional MTBL method.
Figure 3:
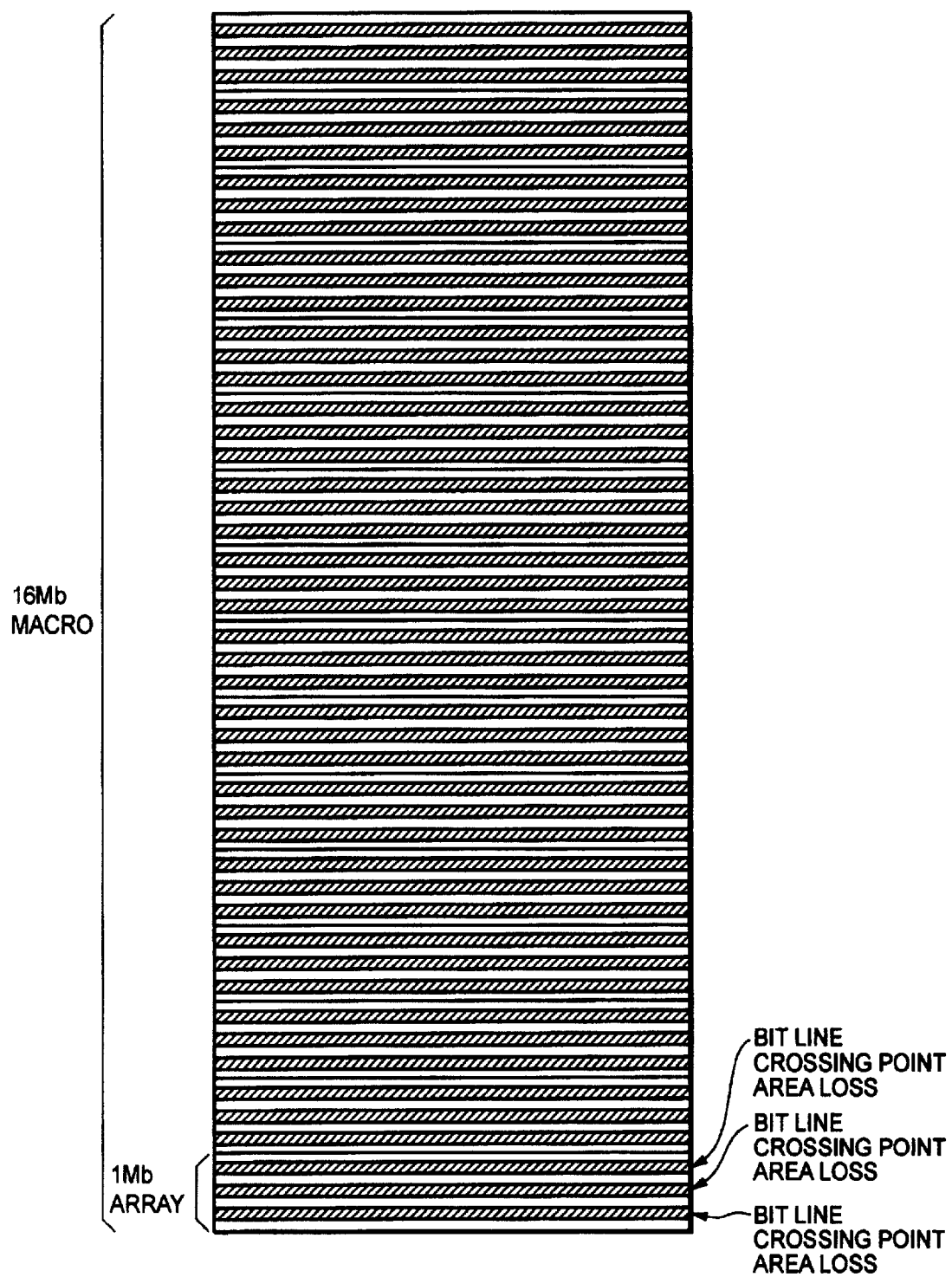
FIG. 3 is a view showing a configuration as a 16 Mb macro in the conventional MTBL method of FIG. 2.

In FIG. 5, the MTBL method similar to that in FIG. 2 is adopted. Therefore, for example, the bit lines of the bit line pair 11 cross at one place on the way, and from the cross, a space between the bit lines is wider. The same is seen in the bit line pair 15. Further, bit lines of a bit line pair 16 do not cross each other, and a space between the bit lines is wider on the way. The same is seen in a bit line pair 17. In the new MTBL method of FIG. 5, both in the bit lines connected to the same sense amplifier and in the bit lines among adjacent bit lines connected to the different sense amplifiers, a space between the bit lines changes (widens or narrows) before and after the cross. Thus, the interference noise between any adjacent bit lines is decreased.

Figure 6:
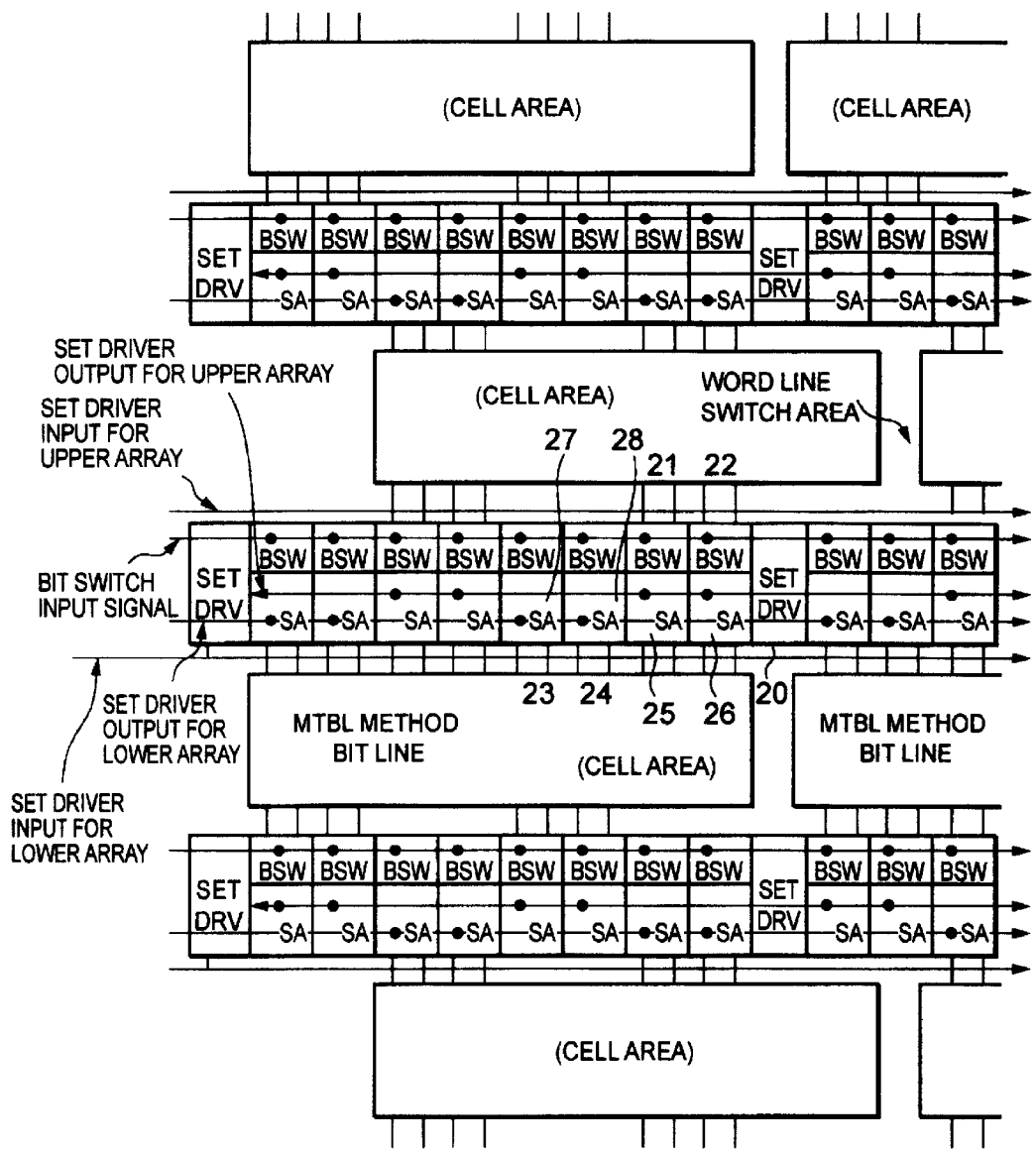
FIG. 6 is a view showing one embodiment of the present invention.

FIG. 6 is a configuration view of one embodiment of the present invention. This configuration comprises bit lines, sense amplifiers (SA), bit switches (BSW), set drivers (SET DRV) in the MTBL method of the prior art, and a new combination of these. With regard to the actual sense amplifier (SA) and bit switch (BSW), two of them (equal to two bit line pairs) are combined together and optimally laid out. 2048 of this align horizontally, while half of them are connected to the bit lines in the upper arrays and the other half of them are connected to the bit lines in the lower arrays, every two of them. Set drivers 20 are disposed dispersedly in stitch areas of word lines or local word line driver areas. The stitch area signifies the area where a wiring metal and polysilicon are connected.

In the configuration of FIG. 6, the set drivers 20 operate in accordance with the selection of upper and lower arrays, and separately activate the sense amplifiers (SA) connected above and below. Specifically, for example, when data is read, the bit line pairs and memory cells 21, 22 arranged in the upper cell area and sense amplifiers (SA) 25, 26 connected thereto, and the bit line pairs and memory cells 23, 24 arranged in the lower cell area and sense amplifiers (SA) 27, 28 connected thereto, are activated at different timing. This is because the upper and lower cell arrays each need to be driven (activated) separately. The bit switches (BSW) operate by a common input signal. Input signals to the set drivers 20 and bit switches (BSW) are generated in a local control area by the side of each array, similarly to the conventional method.

Figure 7:
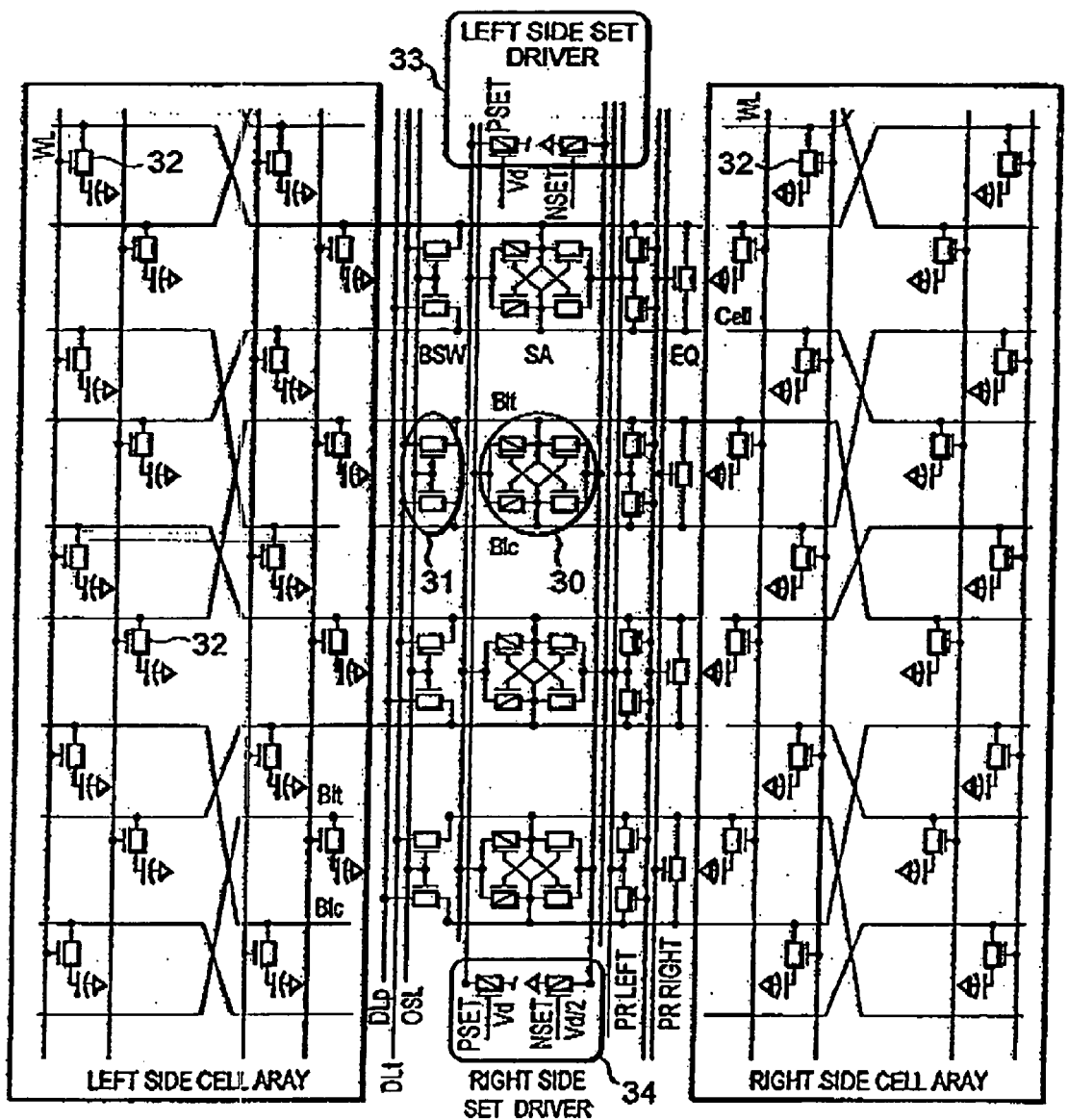
FIG. 7 is a detailed view of the periphery of one line of sense amplifiers in the configuration of the present invention of FIG. 5.

FIG. 7 is a view showing in more detail the periphery of a plurality of aligned sense amplifier lines in the configuration of the present invention of FIG. 5. A sense amplifier SA (30) is arranged in the center, and on its left, a bit switch BSW (31) is disposed. The bit switch BSW (31) is connected to data lines DLt, DTc and bit lines BLt, BLc. In the cell area, at least one or more memory cell(s) 32 is (are) connected to each bit line. Set drivers 33, 34 are disposed above and below the sense amplifier SA (30) line. In the entire DRAM (macro), a plurality of aligned sense amplifiers SA (30) is divided (separated) every more than one of them (M of them, M is a natural number), and the set drivers 33, 34 are arranged in the divided areas. The set drivers 33, 34 activate the plurality of alternate (right side and left side)

sense amplifiers SA (30) at different timing. In other words, the set driver 33 activates the sense amplifiers SA (30) connected to the bit line (cell) disposed on the left side (upper side), and the set driver 34 activates the sense amplifiers SA (30) connected to the bit line (cell) disposed on the right side (lower side). This is because right and left cell arrays each need to be driven (activated) separately.

FIG. 8 shows a size comparison in the case of a vertically cumulated macro of 16 Mb based on the eDRAM of IBM. In FIG. 8, the left section indicates values of array configuration in the new method of the present invention, the center indicates values in a conventional TBL method, and the right indicates values in a conventional MTBL method. If the height of the 16 Mb macro is compared, the array configuration of the present invention is reduced by an area of 112.2 micrometers as compared with the conventional TBL method, and is reduced by an area of 525 micrometers (about 10%) as compared with the conventional MTBL method.

According to the present invention, interference noise between bit lines can be reduced while high density is maintained. Further, the present invention can apply a conventional layout of sense amplifiers and bit switches as it is, and its merit is that it can be easily achieved with only a partial layout change (e.g., change of the metal wiring of the sense amplifiers and set drivers).

What is claimed is:

1. A DRAM circuit comprising a plurality of aligned sense amplifiers,
   bit line pairs connected to the plurality of sense amplifiers, respectively, and
   memory cells connected respectively to the bit lines constituting the bit line pairs, wherein
   the bit line pairs and the memory cells are alternately arranged on a right side (upper side) and a left side (lower side) of the sense amplifiers per N(N: natural number) aligned sense amplifiers, wherein there cross two bit lines constituting the bit line pair arranged on one side of a right side (upper side) and a left side (lower side) of the sense amplifier, and a space between the bit lines widens or narrows from the cross.

2. The DRAM circuit according to claim 1, wherein, further, two bit lines constituting the bit line pair, which is arranged on the other side of the one right side (upper side) or left side (lower side) of the sense amplifier, do not cross, and a space therebetween widens or narrows on the way.

3. The DRAM circuit according to claim 2, wherein the bit line pairs comprise a bit line configuration in a multiple twisted bit line (MTBL) method.

4. A DRAM circuit comprising a plurality of sense amplifiers SA (J, K) arranged in Q lines each containing the P sense amplifiers,
   bit line pairs connected to the plurality of sense amplifiers SA (J, K), respectively, and
   memory cells connected respectively to the bit lines constituting the bit line pairs, wherein
   the sense amplifier SA (J, K) is connected to each of the bit line pairs arranged between the sense amplifier SA (J, K) and a sense amplifier SA (J, K–1) in one next line;
   a sense amplifier SA (J+1, K) is connected to the bit line pairs arranged between the sense amplifier SA (J+1, K) and a sense amplifier SA (J+1, K+1) in another next line;
   a sense amplifier SA (J–2 3, K) is connected to each of the bit line pairs arranged between the sense amplifier SA (J+2 3, K) and a sense amplifier SA (J+2, K–1) in one next line; and
   P and Q are both intergers of more than 3, J is an arbitrary interger of more than 1 and less than P, and K is an arbitrary interger of more than 1 and less than Q, wherein two bit lines constituting the bit line pair, which is arranged in one space between the sense amplifier SA (J, K) and the sense amplifier SA (J, K–1) in the next line, cross, and from the cross, a space between the two bit lines widens or narrows.

5. A DRAM circuit comprising a plurality of sense amplifiers SA (J, K) arranged in Q lines each containing the P sense amplifiers,
   bit line pairs connected to the plurality of sense amplifiers SA (J, K), respectively, and
   memory cells connected respectively to the bit lines constituting the bit line pairs, wherein
   the sense amplifier SA (J, K) is connected to each of the bit line pairs arranged between the sense amplifier SA (J, K) and a sense amplifier SA (J, K–1) in one next line or a sense amplifier SA (J, K+1) in the other next line;
   a sense amplifier SA (J+1, K) is connected to the bit line pairs arranged between sense amplifier SA (J+1, K) and a sense amplifier SA (J +1, K+1) in one next line or a sense amplifier SA (J+1, K–1) in the other next line;
   a sense amplifier SA (J–3, K) is connected to each of the bit line pairs arranged between the sense amplifier SA (J+3, K) and a sense amplifier SA (J+2, K–1) in one next line or a sense amplifier SA (J+2, K+1) in the other next line; and
   P and Q are both intergers of more than 3, J is an arbitrary interger of more than 1 and less than P, and K is an arbitrary interger of more than 1 and less than Q, wherein two bit lines constituting the bit line pair, which is arranged in one space between the sense amplifier SA (J, K) and the sense amplifier SA (J, K+1) or SA (J, K–1) in the next line, cross, and from the cross, a space between the two bit lines widens or narrows and wherein, further, two bit lines constituting the bit line pair, which is arranged in a space opposite to the one space between the sense amplifier SA (J, K) and the sense amplifier SA (J, K+1) or SA (J, K–1) in the next line, do not cross, and a space therebetween widens or narrows on the way.

6. The DRAM circuit according to claim 5, wherein the bit line pairs comprise a bit line configuration in a multiple twisted bit line (MTBL) method.

7. An operation method of a DRAM circuit comprising a plurality of aligned sense amplifiers,
   bit line pairs connected to the plurality of sense amplifiers, respectively, and
   memory cells connected respectively to the bit lines constituting the bit line pairs, wherein
   the bit line pairs and memory cells are alternately arranged on a right side (upper side) and a left side (lower side) of the sense amplifiers per N (N: natural number) aligned sense amplifiers,
   the method comprising a step of activating the plurality of sense amplifiers connected to the bit line pairs and memory cells arranged on the right side (upper side) of the sense amplifiers, and the plurality of sense amplifiers connected to the bit line pairs and memory cells arranged on the left side (lower side) of the sense amplifiers at different timing, when data is read.

8. An operation method of a DRAM circuit comprising:

a plurality of sense amplifiers arranged in Q lines each containing the P sense amplifiers;

bit line pairs connected to the plurality of sense amplifiers, respectively; and memory cells connected respectively to the bit lines constituting the bit line pairs, wherein the bit line pairs and the memory cells are arranged every N (N: natural number) aligned sense amplifiers in the Q lines, alternately on a right side (upper side) and a left side (lower side) of the sense amplifiers, and P and Q are both integers of more than 3, and N is an arbitrary integer of more than 1 and less than (P/3);

the method comprising a step of activating the plurality of sense amplifiers connected to the bit line pairs and memory cells arranged on the right side (upper side) of the sense amplifiers, and the plurality of sense amplifiers connected to the bit line pairs and memory cells arranged on the left side (lower side) of the sense amplifiers at different timing, when data is read.

9. An operation method of a DRAM circuit comprising:

a plurality of sense amplifiers SA (J, K) arranged in Q lines each containing the P sense amplifiers;

bit line pairs connected to the plurality of sense amplifiers SA (J, K), respectively; and memory cells connected respectively to the bit lines constituting the bit line pairs, wherein the sense amplifier SA (J, K) is connected to each of the bit line pairs arranged between the sense amplifier SA (J, K) and a sense amplifier SA (J, K−1) in one next line or a sense amplifier SA (J, K+1) in the other next line;

a sense amplifier SA (J+1, K) is connected to the bit line pair arranged between the sense amplifier SA (J+1, K) and a sense amplifier SA (J+1, K+1) in one next line or a sense amplifier SA (J+1, K−1) in the other next line;

a sense amplifier SA (J+3, K) is connected to the bit line pair arranged between the sense amplifier SA (J+3, K) and a sense amplifier SA (J+2, K−1) in one next line or a sense amplifier SA (J+2, K+1) in the other next line; and P and Q are both integers of more than 3, J is an arbitrary integer of more than 1 and less than P, and K is an arbitrary integer of more than 1 and less than Q;

the method comprising a step of activating the sense amplifier SA (J+1, K) at timing different from the sense amplifier SA (J, K) and the sense amplifier SA (J+3, K), when data is read.

10. An operation method of a DRAM circuit comprising:

a plurality of sense amplifiers SA (J, K) arranged in Q lines each containing the P sense amplifiers;

bit line pairs connected to the plurality of sense amplifiers SA (J, K), respectively; and memory cells connected respectively to the bit lines constituting the bit line pairs, wherein sense amplifier SA (J, K) and a sense amplifier SA (J+1, K) are each connected to each of the bit line pairs arranged between a sense amplifier SA (J, K−1) in one next line and a sense amplifier SA (J+1, K−1) or between a sense amplifier SA (J, K+1) in the other next line and a sense amplifier SA (J+1, K+1);

a sense amplifier SA (J+2, K) and a sense amplifier SA (J+3, K) are each connected to the bit line pairs arranged between a sense amplifier SA (J+2, K+1) in one next line and a sense amplifier SA (J+3, K+1) or between a sense amplifier SA (J+2, K−1) in the other next line and a sense amplifier SA (J+3, K−1);

a sense amplifier SA (J+4, K) and a sense amplifier SA (J+5, K) are each connected to each of the bit line pairs arranged between a sense amplifier SA (J+4, K−1) in one next line and a sense amplifier SA (J+5, K−1) or between a sense amplifier SA (J+4, K+1) in the other next line and a sense amplifier SA (J+4, K+1); and P and Q are both integers of more than 6, J is an arbitrary integer of more than 1 and less than P, and K is an arbitrary integer of more than 1 and less than Q;

the method comprising a step of activating the sense amplifier SA (J, K), the sense amplifier SA (J+1, K), the sense amplifier SA (J+4, K) and the sense amplifier SA (J+5, K) at timing different from the sense amplifier SA (J+2, K) and the sense amplifier SA (J+3, K), when data is read.

* * * * *